US007271693B2

(12) United States Patent
Ding et al.

(10) Patent No.: US 7,271,693 B2
(45) Date of Patent: Sep. 18, 2007

(54) ON-CHIP INDUCTOR WITH MAGNETIC CORE

(75) Inventors: Hanyi Ding, Essex Junction, VT (US); Kai Di Feng, Essex Junction, VT (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/400,669

(22) Filed: Apr. 7, 2006

(65) Prior Publication Data

US 2006/0186983 A1    Aug. 24, 2006

Related U.S. Application Data

(62) Division of application No. 10/604,180, filed on Jun. 30, 2003, now Pat. No. 7,061,359.

(51) Int. Cl.
*H01F 5/00*    (2006.01)
(52) U.S. Cl. ..................................... 336/200
(58) Field of Classification Search ............... 336/65, 336/83, 200, 220–222, 232–234; 257/531
See application file for complete search history.

(56) References Cited

U.S. PATENT DOCUMENTS

| 3,935,340 A |   | 1/1976 | Yamaguchi et al. ......... 427/216 |
| 4,959,631 A | * | 9/1990 | Hasegawa et al. ............ 336/83 |
| 5,679,402 A |   | 10/1997 | Lee ............................. 427/127 |
| 5,693,447 A |   | 12/1997 | Takeyama et al. .......... 430/201 |
| 5,847,634 A |   | 12/1998 | Korenivski et al. ......... 336/200 |
| 6,060,211 A |   | 5/2000 | Sugitani ...................... 430/262 |
| 6,441,715 B1 |   | 8/2002 | Johnson ....................... 438/200 |
| 6,452,247 B1 |   | 9/2002 | Gardner ....................... 257/528 |

(Continued)

FOREIGN PATENT DOCUMENTS

JP    02-068907    3/1990

(Continued)

OTHER PUBLICATIONS

RF Polymers for Integrated Sensors; Dr. William J. Kent; Mission Research Corp.; Oct. 19, 2001.

(Continued)

*Primary Examiner*—Tuyen T. Nguyen
(74) *Attorney, Agent, or Firm*—Downs Rachlin Martin PLLC

(57) ABSTRACT

An inductor formed on an integrated circuit chip including one or more inner layers between two or more outer layers, inductor metal winding turns included in one or more inner layers, and a magnetic material forming the two or more outer layers and the one or more inner layers. In one embodiment, the magnetic material is a photoresist paste having magnetic particles. In another embodiment, the magnetic material is a series of magnetic metallic strips disposed on each of first and second portions of the two or more outer layers and on each of the one or more inner layers. The series of magnetic metallic strips on the first and second portions form a grid pattern. Other embodiments include an adjustable controlled compound deposit and control windings with adjustable electrical currents.

6 Claims, 7 Drawing Sheets

U.S. PATENT DOCUMENTS

| | | |
|---|---|---|
| 6,514,575 B2 | 2/2003 | Leddy et al. ............... 427/550 |
| 6,522,579 B2 | 2/2003 | Hoenigschmid ............ 365/173 |
| 7,061,359 B2 | 6/2006 | Ding et al. |
| 7,078,999 B2 * | 7/2006 | Uriu et al. ................. 336/200 |
| 2004/0026310 A1 | 2/2004 | Larsen |

FOREIGN PATENT DOCUMENTS

| | | |
|---|---|---|
| JP | PUPA05-190367 | 7/1993 |
| JP | PUPA07-176444 | 7/1995 |
| JP | PUPA08-162330 | 6/1996 |
| JP | PUPA2001-267155 | 9/2001 |

OTHER PUBLICATIONS

RF Polymers for Integrated Sensors; Dr. Yakov Khodorkovsky; Beltran, Inc.; Oct. 23, 2001.

* cited by examiner

ON-CHIP INDUCTOR WITH MAGNETIC CORE

RELATED APPLICATION DATA

This application is a divisional of U.S. patent application Ser. No. 10/604,180, filed Jun. 30, 2003 now U.S. Pat. No. 7,061,359, and titled "On-Chip Inductor with Magnetic Core," which is incorporated by reference herein in its entirety.

FIELD OF THE INVENTION

The present invention relates to an inductor on an integrated circuit chip, and in particular to an inductor having a magnetic core on an integrated circuit chip.

BACKGROUND OF THE INVENTION

In recent integrated circuit chip design, it is often desired to provide passive electrical devices such as inductors directly on the chip as part of the integrated circuit. Inductors are required in various microelectronic applications, e.g. voltage control oscillators and power amplifiers.

In addition, inductors are often used in radio frequency (RF) circuits such as those used in devices like cellular telephones, wireless modems, and other types of wireless communication equipment. An inductor joined in series or parallel with a capacitor can form a frequency resonator or filter unwanted signals.

However, due to the limited space on an integrated circuit chip and highly competitive chip market, on-chip inductors must fit within a limited space and be inexpensive to fabricate. In that regard, it is desirable for an on-chip inductor to have a high inductance per unit area.

Prior art on-chip inductors with air core have encountered many problems. Typically, they require too much space on the integrated circuit chip. Often, the Q factor of the air core on-chip inductor is too low. Many prior art on-chip inductors include an air core inductor that has an open magnetic field. Such designs often generate interference and/or unwanted magnetic coupling that may cause instability problems. In addition, prior art air core on-chip inductors often exhibit an eddy current in the near metal or substrate of low volume resistivity that further reduces the inductor's Q value. Another shortcoming of prior art air core on-chip inductors is that their inductances are not adjustable. A lack of adjustability results in a low yield rate when process variations occur. Finally, prior art air core on-chip inductors are not suitable for very high frequency applications, i.e., higher than 10 GHz, because their large size presents large parasitic capacitance and the self-resonate frequency would be lower than the operation frequency.

SUMMARY OF THE INVENTION

One aspect of the present invention is an inductor formed on an integrated circuit chip. The inductor includes two or more outer layers, one or more inner layers between the two or more outer layers, inductor metal winding turns included in the one or more inner layers, and a photoresist paste having magnetic particles. The photoresist paste at least partially forms the two or more outer layers and the one or more inner layers.

Another aspect of the present invention is an inductor formed on an integrated circuit chip, the inductor including two or more outer layers each including a first portion and a second portion, one or more inner layers between the two or more outer layers, inductor metal winding turns included in the one or more inner layers, and a series of magnetic metallic strips disposed on each of the first and second portions of the two or more outer layers and on each of the one or more inner layers. The series of magnetic metallic strips on the first portion and the second portion are arranged so as to form a grid pattern.

Still another aspect of the present invention is a method of forming an inductor having a magnetic core. The method includes the following steps: providing one or more chambers, each having one or more metals disposed therein; heating the one or more metals so as to generate vapors of the one or more metals; forming a magnetic material from the vapors of the one or more metals; providing an integrated circuit chip having at least one silicon oxide layer, the at least one silicon oxide layer having an etched opening; and depositing the magnetic material in the etched opening of the at least one silicon oxide layer.

Yet another aspect of the present invention is an inductor formed on an integrated circuit chip, the inductor including two or more outer layers, one or more inner layers between the two or more outer layers, inductor metal winding turns and a control winding in the one or more inner layers, and at least one of a soft magnetic core material and a hard magnetic core material included in each of the two or more outer layers and the one or more inner layers.

Other features, utilities and advantages of various embodiments of the invention will be apparent from the following more particular description of embodiments of the invention as illustrated in the accompanying drawings.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE INVENTION

The present invention is an on-chip inductor having a magnetic core. The magnetic core allows the inductor to have a reduced size and an increased Q value. The magnetic field of the inductor is contained to the magnetic core to form a closed magnetic loop thereby improving circuit stability. In one embodiment, the level of inductance may be controlled. In another embodiment, the use of ferrite allows for high-speed applications. The various conductive, insulating, and magnetic layers and cores described herein may be formed by any suitable method known to those skilled in the art, including but not limited to sputtering, electroplating, chemical vapor deposition, plasma enhanced chemical vapor deposition, physical vapor deposition, and the like.

Figure 1:
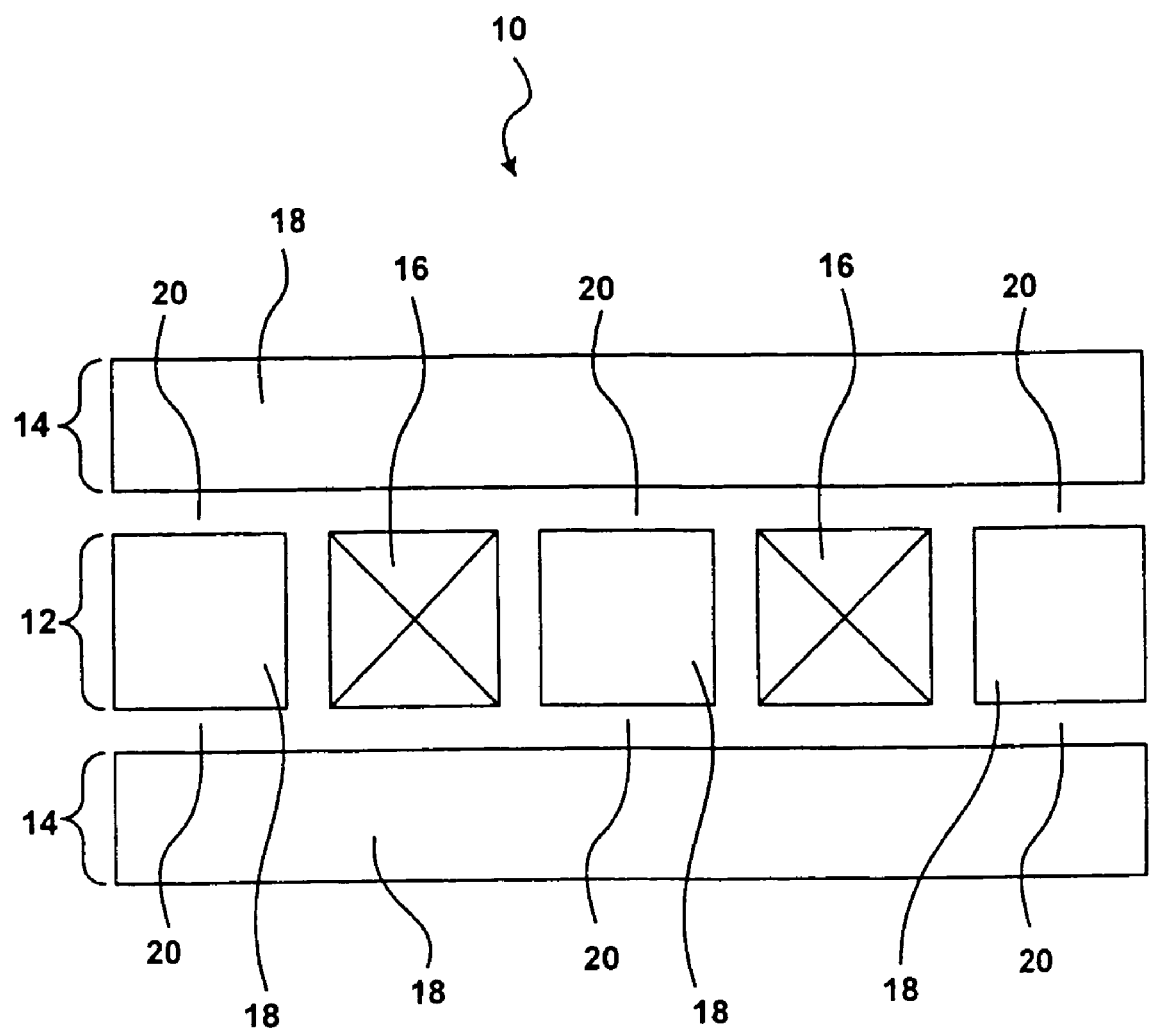
FIG. 1 is a cross-sectional view of a magnetic core inductor according to one embodiment of the present invention.

FIG. 1 illustrates a cross-sectional view of a representative basic structure of an on-chip inductor 10 according to one embodiment of the present invention. An inner layer 12 is located between outer layers 14. Inductor metal winding turns 16 are located within inner layer 12 and disposed around a magnetic material, referred to as magnetic core 18 herein. Magnetic core 18 is also located on the outsides of inductor metal winding turns 16. In addition, outer layers 14 are made up of magnetic core 18. Gaps 20 between each of outer layers 14 and inner layer 12 may help avoid magnetic flux saturation. In addition, because the width of each of gaps 20 is very small, the magnetic field leakage of the gaps is negligible. In other embodiments, the width of each of gaps 20 may be reduced to zero to form a completely closed magnetic loop thereby maximizing inductance and the Q value of the inductor. As one skilled in the art will appreciate, other embodiments may include any of myriad configurations that include greater than one of any or both of inner layer 12 or outer layers 14.

Figure 2A:
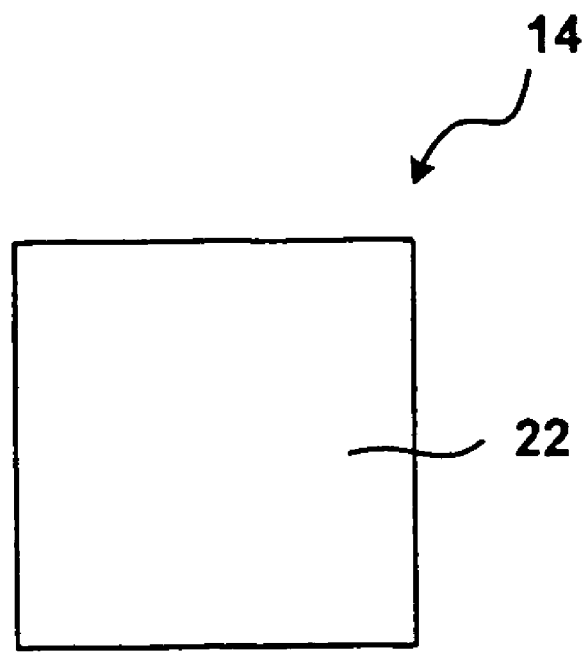
FIG. 2A is a plan view of a top layer of one magnetic core inductor according to one embodiment of the present invention.
Figure 2B:
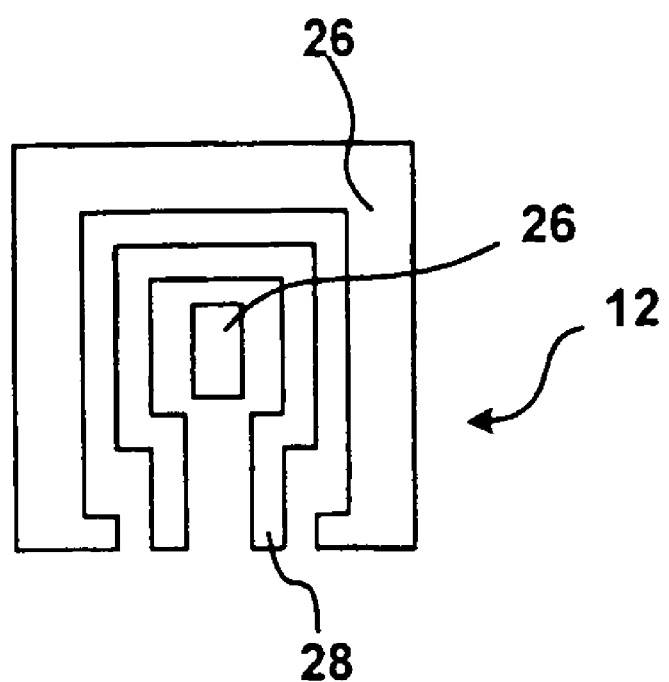
FIG. 2B is a plan view of a middle layer of one magnetic core inductor according to one embodiment of the present invention.

Utilizing the structure described above with respect to FIG. 1, alternative embodiments of the present invention may be developed having varying magnetic core materials and providing different performance characteristics. FIGS. 2A and 2B illustrate the particular magnetic core materials that are included in the layers of a three-layer embodiment. As illustrated in FIG. 2A, at least surface 22 of outer layers 14 are substantially made of a photoresist paste containing a powder of magnetic material (as discussed in greater detail below). FIG. 2B illustrates inner layer 12 that includes an outside and center material 26 surrounding an inductor metal wire turns 28. Outside material and center material 26 is also made of photoresist paste. In addition, as one skilled in the art will appreciate, silicon oxide is typically positioned between outside and center material 26 and inductor metal wire turns 28, although other materials may also be used.

Photoresist paste electrically isolates discrete magnetic particles within the magnetic powder included in the paste. The electrical isolation causes a high resistance to develop between the magnetic particles in the photoresist paste. As a result, the eddy current is significantly reduced or eliminated, thus keeping the Q value of the inductor high. The structure illustrated in FIGS. 2A and 2B may be used with both metal-based magnetic materials and iron oxide-based magnetic materials.

There are typically two categories of basic magnetic materials used in the present invention. The first category includes metal-based material such as Fe (iron), Ni (nickel), Cu (copper), Mo (molybdenum), Mn (manganese), Cr (chromium), etc. The second category includes iron oxide based material, i.e., ferrite, such as $MnFe_2O_3$, $CuFe_2O_3$, $ZnFe_2O_3$, $NiFe_2O_3$, etc. The magnetic photoresist paste is typically produced by mixing either metal or ferrite powder, i.e., magnetic powder, with integrated circuit chip compatible pastes such as SILK or polyimide. The magnetic powder may have particle sizes as small as the nanometer range.

Although the structure illustrated in FIG. 1 has three layers, in order to increase the magnetic loop cross-sectional area and increase the turns of the inductor, structures of more than three layers may be used. For example, a six-layer structure may be fabricated where layers 1, 2, 5, and 6 are as illustrated in FIG. 2A and layers 3 and 4 are as illustrated in FIG. 2B.

Figure 3A:
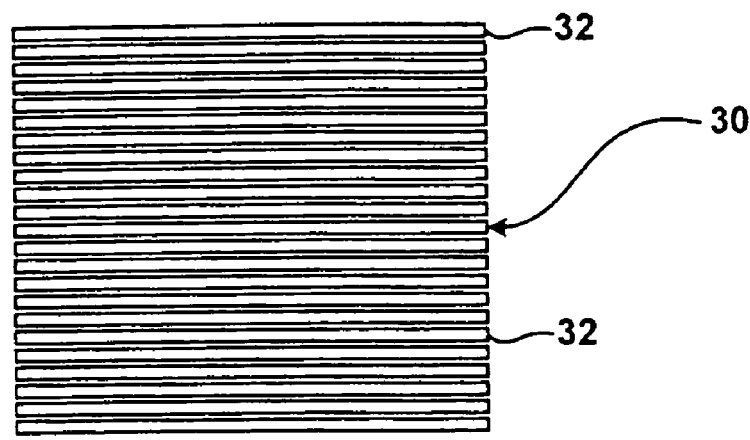
FIG. 3A is a top plan view of a top layer of one magnetic core inductor according to one embodiment of the present invention.
Figure 3B:
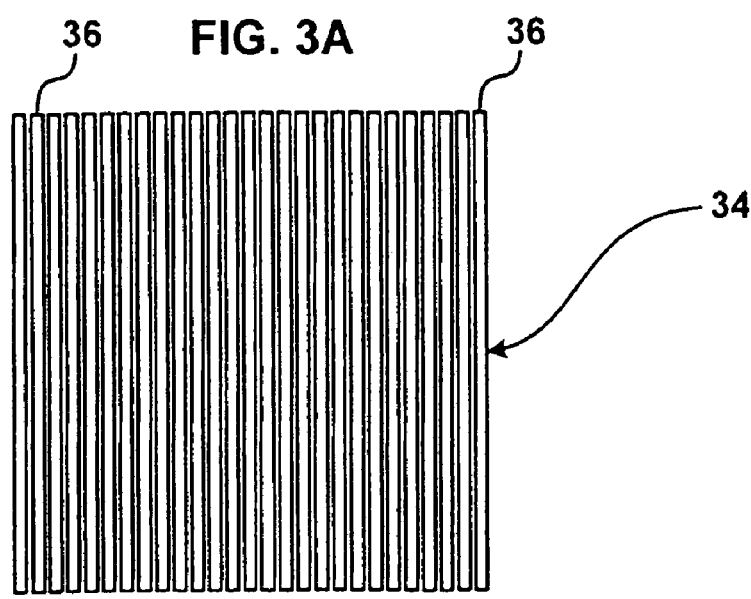
FIG. 3B is a top plan view of an intermediate layer of one magnetic core inductor according to one embodiment of the present invention.
Figure 3C:
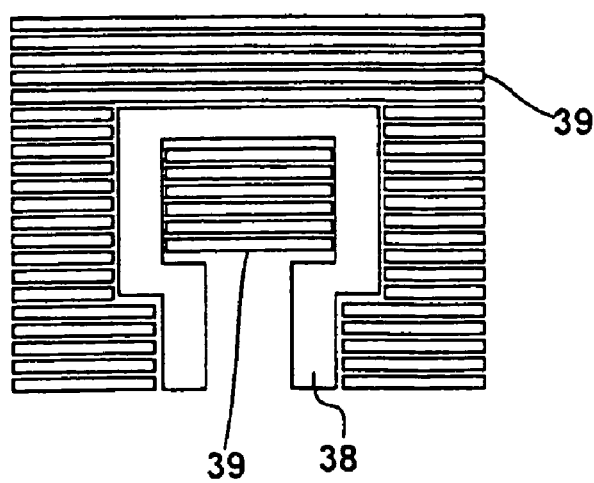
FIG. 3C is a top plan view of a middle layer of one magnetic core inductor according to one embodiment of the present invention.

FIGS. 3A–3C illustrate an alternative embodiment of on-chip inductor 10. This embodiment of inductor 10 has a three-layer structure having strips of metal-based magnetic materials. The layers are arranged to develop a particular pattern. Layers 1 and 3 each include a first portion 30 having horizontally arranged magnetic strips 32 as illustrated in FIG. 3A and a second portion 34 having vertically arranged magnetic strips 36 as illustrated in FIG. 3B. In one embodiment, the particular pattern developed by magnetic strips 32 and magnetic strips 36 is a perfect orthogonal grid pattern. Other transverse patterns are also encompassed by the present invention. Layer 2 includes inductor metal wire turns 38 surrounded by horizontally arranged strips of magnetic material 39.

Vapor deposition or sputtering may be used to deposit the metal-based magnetic materials used in the embodiment of inductor 10 shown in FIGS. 3A–3C. Vapor deposition produces a high density of magnetic materials, but undesirably high eddy currents may result when the magnetic materials are deposited with certain configurations. To address this problem, strips 32, 36, and 39 are deposited in a particular pattern in the various layers of inductor 10 described above. This pattern significantly reduces or eliminates the eddy currents thereby keeping the Q value of the inductor high. As one skilled in the art will appreciate, alternative layering patterns may also be used so long as they provide the same advantages as the embodiment illustrated in FIGS. 3A–3C.

Figure 4:
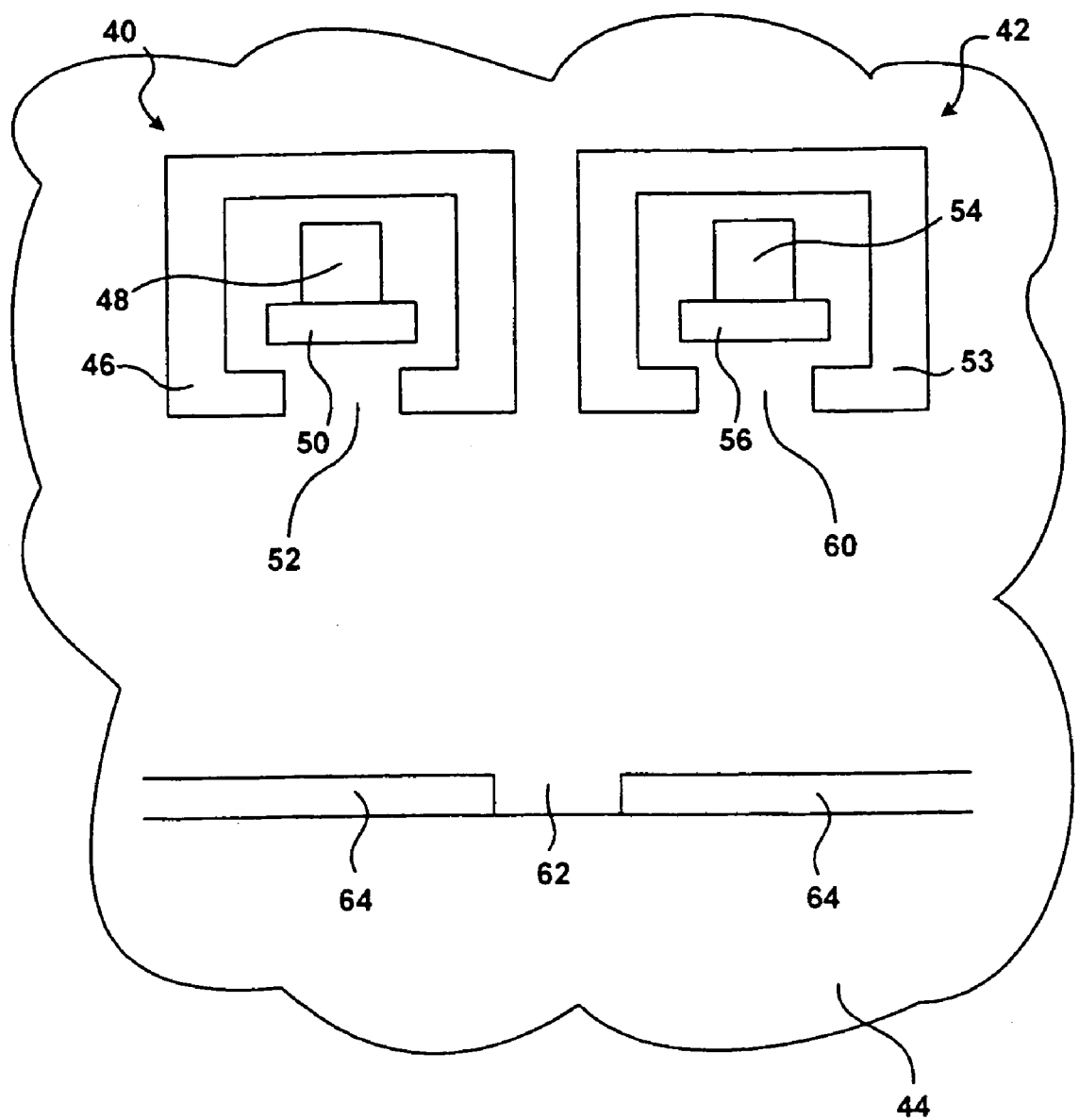
FIG. 4 is a schematic illustration of an apparatus for fabricating the inductor of the present invention and a cross-sectional view of material used to make the inductor.

Referring now to FIG. 4, the present invention includes a method of generating iron oxide-based magnetic material and depositing it on inductor cores. The method allows for an adjustable, controllable compound deposit of magnetic materials on inductor cores. As part of the method, process equipment, including box-like first chamber 40 and second chamber 40, located in an oxygen environment 44, is provided. First chamber 40 is defined by a chamber wall 46 within which is located an electric heater 48 and a metal element 50. A portion of chamber wall 46 includes an adjustable aperture 52. Second chamber 42 is defined by a chamber wall 53 that includes an electric heater 54 and a metal element 56. A portion of chamber wall 53 includes an adjustable aperture 60. As part of the method of generating iron oxide-based magnetic material, iron oxide-based magnetic material is deposited in an etched opening 62 in a silicon oxide layer 64 that forms the inductor core.

Both first chamber 40 and second chamber 42 generate a vapor of metal (not shown). The vapor flow of first chamber 40 and second chamber 42 is controlled by adjusting apertures 52 and 60, respectively, and the current flowing to heaters 48 and 54, respectively. In one embodiment, metal 50 and metal 56 are two-component metals in an iron oxide-based magnetic material, e.g., iron and nickel. In oxygen environment 44, the vapor of iron and vapor of nickel form iron oxide-based magnetic material compound, i.e., $NiFe_2O_3$. The compound is deposited in etched opening 62 on silicon oxide layer 64. As one skilled in the art will understand, the proper flows of iron and nickel are achieved by controlling the oxygen density and temperature.

Figure 5:
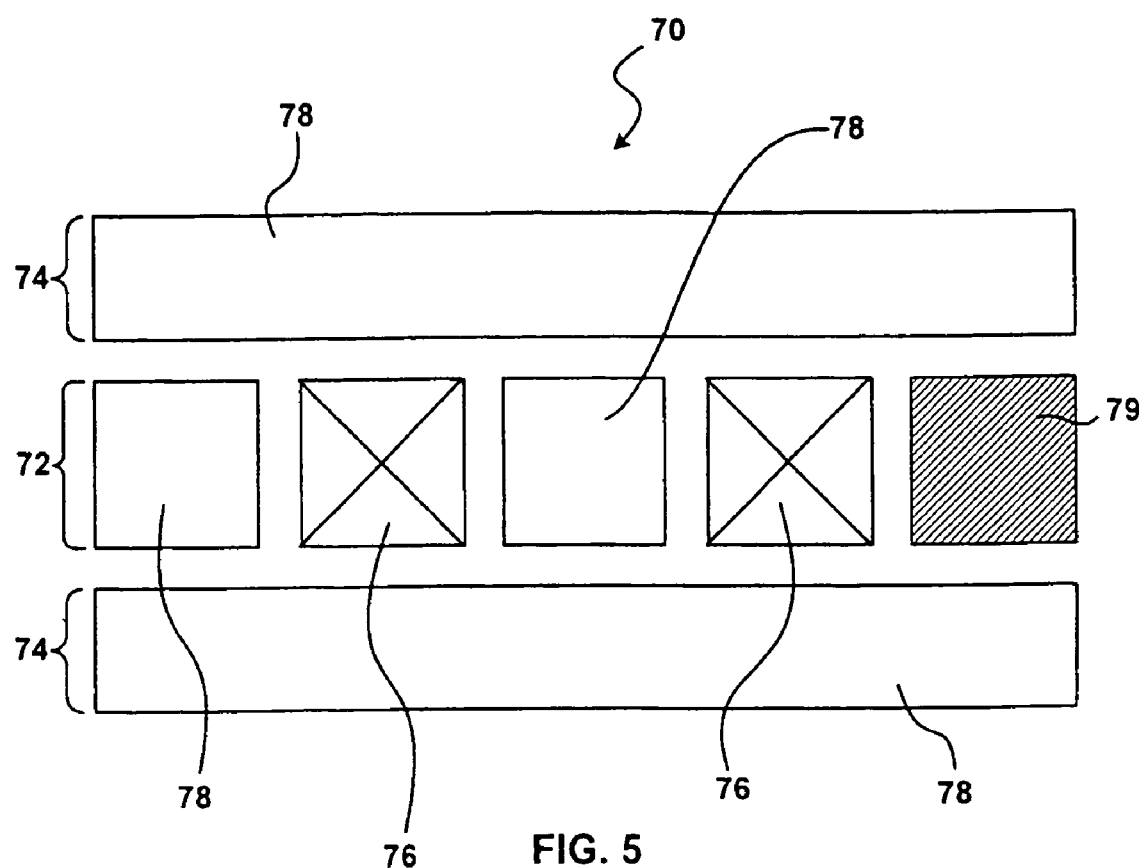
FIG. 5 is a cross-sectional view of a ferrite magnetic core inductor with bias magnetic field of hard magnetic material according to one embodiment of the present invention.
Figure 6:
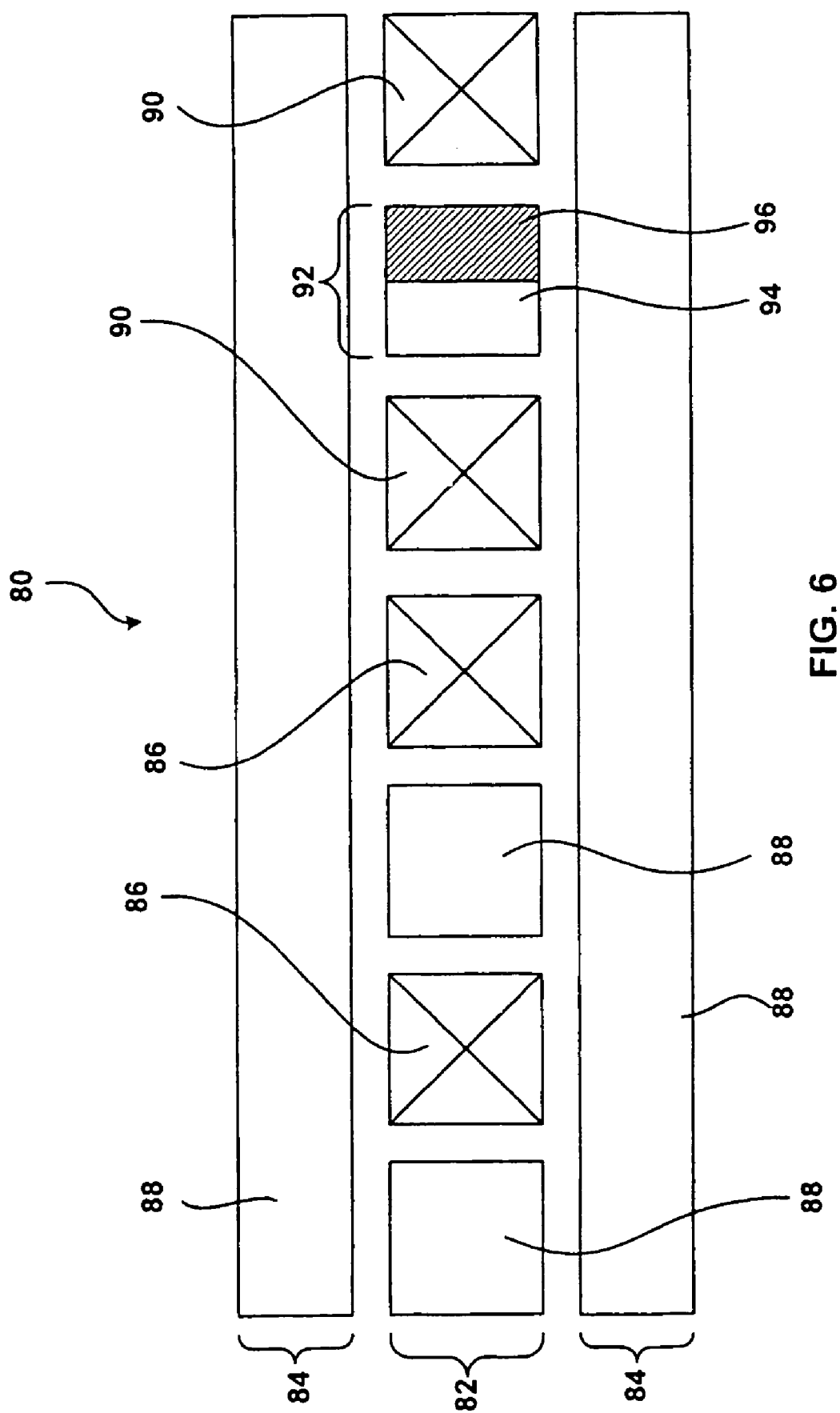
FIG. 6 is a cross-sectional view of a magnetic core inductor having a control winding disposed around a core including both soft and hard magnetic materials according to one embodiment of the present invention.
Figure 7:
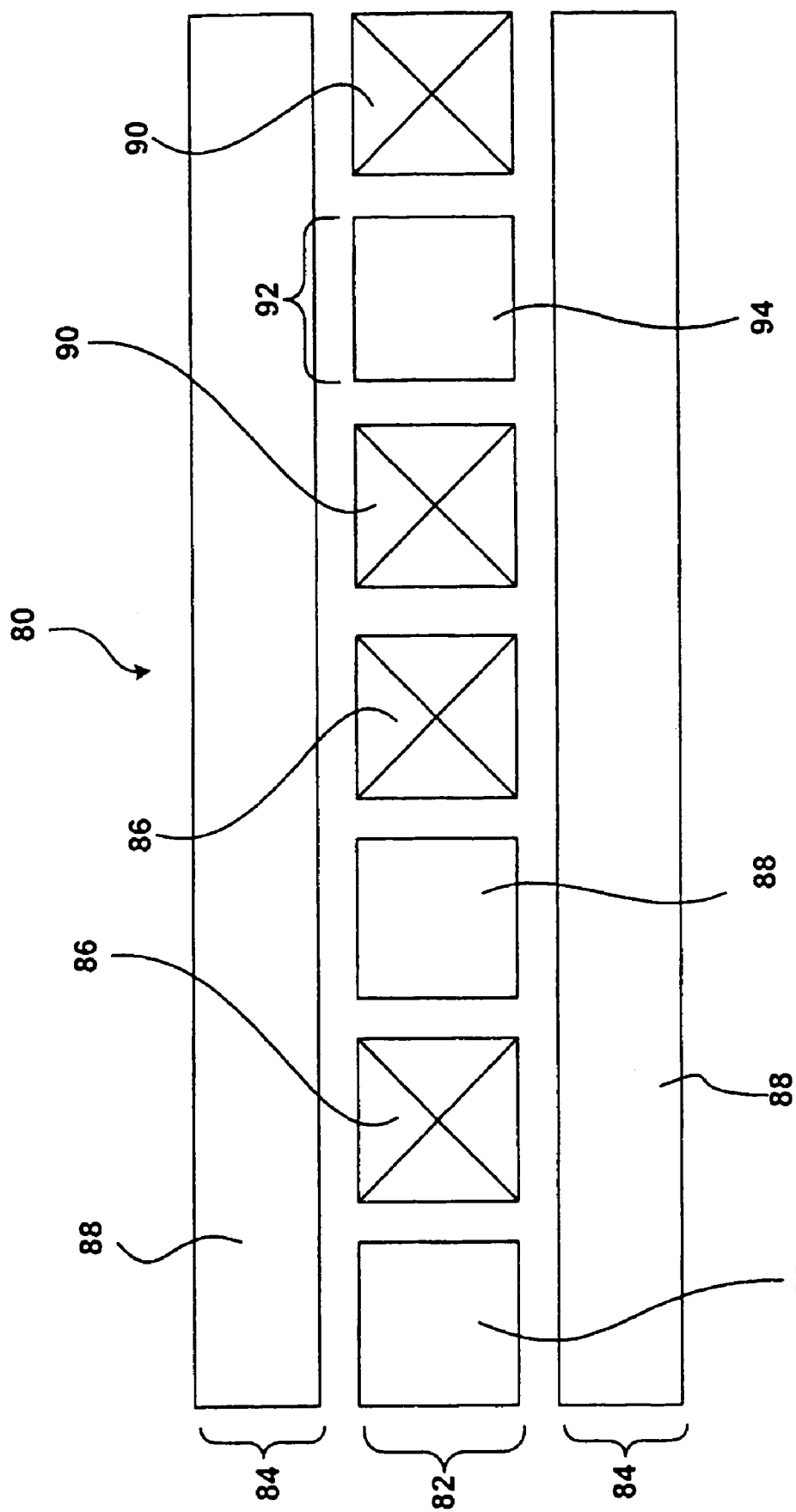
FIG. 7 is a cross-sectional view of a magnetic core inductor having a control winding disposed around a core including soft magnetic material according to one embodiment of the present invention.

FIGS. 5, 6, and 7 illustrate additional embodiments of the inductor 10 of the present invention. FIG. 5 illustrates a cross-sectional view of a representative base structure of an on-chip inductor structure 70 for use in very high frequency applications, i.e., greater than 10 GHz. On-chip inductor structure 70 includes an inner layer 72 between outer layers 74. Inductor metal wire turns 76 are located within inner layer 72 and are disposed around a soft magnetic material referred to herein as soft magnetic core 78. Unlike on-chip inductor structure 10 in FIG. 1, in on-chip inductor structure 70, a hard magnetic material referred to as hard magnetic core 79 herein is adjacent one side of inductor metal wire turns 76. Outer layers 74 are typically made up of soft magnetic core 78. Both the soft and hard magnetic materials utilized in structure 70 are typically ferrite-based, although other materials may be used in certain applications. As in FIG. 1, various gap widths may exist between inner layer 72 and each of outer layers 74. In addition, the alternative embodiments, more than one of any, all, or any combination of inner layer 72 and outer layers 74 may be present.

Residual magnetic flux density and coercive force are two magnetism performance parameters used to categorize two typical kinds of magnetic materials used in the present invention. The first kind of magnetic material is a soft magnetic material that has a low residual magnetic flux density and a small coercive force. The soft magnetic material is used to increase the inductances and improve Q values of inductors in the invention. The second kind of magnetic material is a hard magnetic material that has a high residual magnetic flux density and a large coercive force. The hard magnetic material is used to set a bias magnetic field for the operation point in the invention.

As one skilled in the art understands, an iron oxide-based magnetic material such as ferrite is typically used for very high frequency applications. However, its initial permeability is very small at an external magnetic field H of zero. Thus, an external magnetic field is required to set an operation point where the permeability is large. In practice, when on-chip inductor structure 70 that includes both soft and hard magnetic materials is heated to a temperature in excess of the Curie temperature, i.e., 300° to 600° C., the hard magnetization material used in hard magnetic core 76 loses its magnetization or exhibits spontaneous magnetization. Thus, when integrated circuit chips containing on-chip inductor structure 70 are packaged, they require an external magnetic field to activate the hard magnetic material in hard magnetic core 79. The re-magnetized hard magnetic core 79 sets a bias magnetic field for the ferrite. The bias magnetic field increases the permeability to the required operation point for ferrite. Ferrite may have very high volume resistivity and very low loss so that it may operate at very high frequency, i.e., up to more than 100 GHz. Since the relative permeability of ferrite is near one at zero magnetic field, i.e., the initial permeability is close to 1, it needs a bias magnetic field to set the operation point with large relative permeability. It also provides the conditions required to adjust the relative permeability of ferrite by change of the bias magnetic field. In addition, as with the embodiment illustrated in FIG. 1, the embodiment illustrated in FIG. 5 may include other configurations providing a combination of soft and hard magnetic materials are used.

FIGS. 6 and 7 illustrate cross-sectional views of a representative base structure of an on-chip inductor structure 80 that allows for adjustability of the inductor's inductance. On-chip inductor structure 80 includes an inner layer 82 in between outer layers 84. Inductor metal wire turns 86 are located within inner layer 82 and disposed around a soft magnetic material referred to as soft magnetic core 88 herein. Unlike the structure illustrated in FIGS. 1 and 5, adjacent one side of inductor metal wire turns 86 is a control winding 90. In the embodiment illustrated in FIG. 6, control winding 90 is disposed around a core 92 having both a soft magnetic material referred to as soft magnetic core 94 and a hard magnetic material referred to as hard magnetic core 96. Outer layers 84 are typically made up of soft magnetic core 88. Of course, as illustrated in FIG. 7, in other embodiments, core 92 may only include soft magnetic material 94. Both the soft and hard magnetic materials utilized in the structure illustrated in FIGS. 6 and 7 are typically ferrite-based, although other materials may be used in certain applications. As in the above-described embodiments, the structures illustrated in FIGS. 6 and 7 may include various gap widths between inner layer 82 and outer layers 84. In addition more than one of each of inner layer 82 and outer layers 84 may be present.

In practice, a DC current applied to control winding 90 generates the bias magnetic field necessary to reach the operation point of the ferrite magnetic materials used in both soft magnetic cores 88 and core 92. The permeability may be adjusted by tuning the current so that the inductance is adjustable as well.

The on-chip inductor of the present invention offers a variety of benefits. By using magnetic material in the core of the inductor, the size of the inductor is reduced and the Q value is increased. In the present invention, the magnetic field of the inductor is closed in the magnetic core thereby reducing interference with other chip components. Use of ferrite in the inductor core allows the inductor to operate at very high frequencies. Finally, by changing the DC magnetic bias using a control winding, the inductance of the inductor may be controlled or adjusted.

While the present invention has been described in connection with specified embodiments, it will be understood that it is not so limited. On the contrary, it is intended to cover all alternatives, modifications and equivalents as may be included within the spirit and scope of the invention as defined in the appended claims.

What is claimed is:

1. An inductor formed on an integrated circuit chip, the inductor comprising:

two or more outer layers;

one or more inner layers between said two or more outer layers;

inductor metal winding turns and a control winding in said one or more inner layers; and at least one of a soft magnetic core material and a hard magnetic core material included in each of said two or more outer layers and said one or more inner layers.

2. An inductor according to claim 1, wherein said control winding is disposed around a core including said soft magnetic material and said hard magnetic material.

3. An inductor according to claim 1, wherein said soft magnetic core material and said hard magnetic core material are substantially iron oxide-based.

4. An inductor according to claim 1, wherein said control winding is disposed around a core including only said soft magnetic material.

5. An inductor according to claim 1, wherein said hard magnetic core material is adapted to create magnetic biasing within the inductor.

6. An inductor according to claim 1, wherein said inductor metal winding turns is disposed around a core including said soft magnetic material.

* * * * *